United States Patent
Fazelpour et al.

(10) Patent No.: US 6,713,853 B1
(45) Date of Patent: Mar. 30, 2004

(54) ELECTRONIC PACKAGE WITH OFFSET REFERENCE PLANE CUTOUT

(75) Inventors: Siamak Fazelpour, San Diego, CA (US); Michel Fleury, San Diego, CA (US); Mark Patterson, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 10/202,322

(22) Filed: Jul. 23, 2002

(51) Int. Cl.[7] .............................................. H01L 23/02
(52) U.S. Cl. ...................... 257/680; 257/691; 257/693; 257/662; 257/663; 257/664
(58) Field of Search ................... 257/680, 691, 257/693, 662, 663, 664

(56) References Cited

U.S. PATENT DOCUMENTS

| | | | | |
|---|---|---|---|---|
| 4,379,307 A | * | 4/1983 | Soclof | 333/236 |
| 5,495,125 A | * | 2/1996 | Uemura | 257/666 |
| 5,672,911 A | * | 9/1997 | Patil et al. | 257/691 |
| 5,932,927 A | * | 8/1999 | Koizumi et al. | 257/728 |
| 6,008,534 A | * | 12/1999 | Fulcher | 257/691 |
| 6,084,297 A | * | 7/2000 | Brooks et al. | 257/698 |
| 6,448,575 B1 | * | 9/2002 | Slocum et al. | 257/48 |
| 6,495,911 B1 | * | 12/2002 | Buffet et al. | 257/700 |
| 2003/0015804 A1 | * | 1/2003 | Staiculescu et al. | 257/778 |

* cited by examiner

Primary Examiner—Jasmine Clark
(74) Attorney, Agent, or Firm—INCAPLAW; Terrance A. Meador

(57) ABSTRACT

An electronic package, such as a ball grid array ("BGA") package, includes a high speed signal trace formed at a conductive layer and a corresponding reference plane formed at another conductive layer. The reference plane includes a cutout region formed therein; the cutout region is positioned over the signal solder ball to which the high speed signal trace is coupled. The lateral center point of the cutout region is offset relative to the lateral center point of the signal solder ball. The offset configuration reduces the capacitance between the signal solder ball and the reference plane and improves the high frequency transmission characteristics of the electronic package.

18 Claims, 10 Drawing Sheets

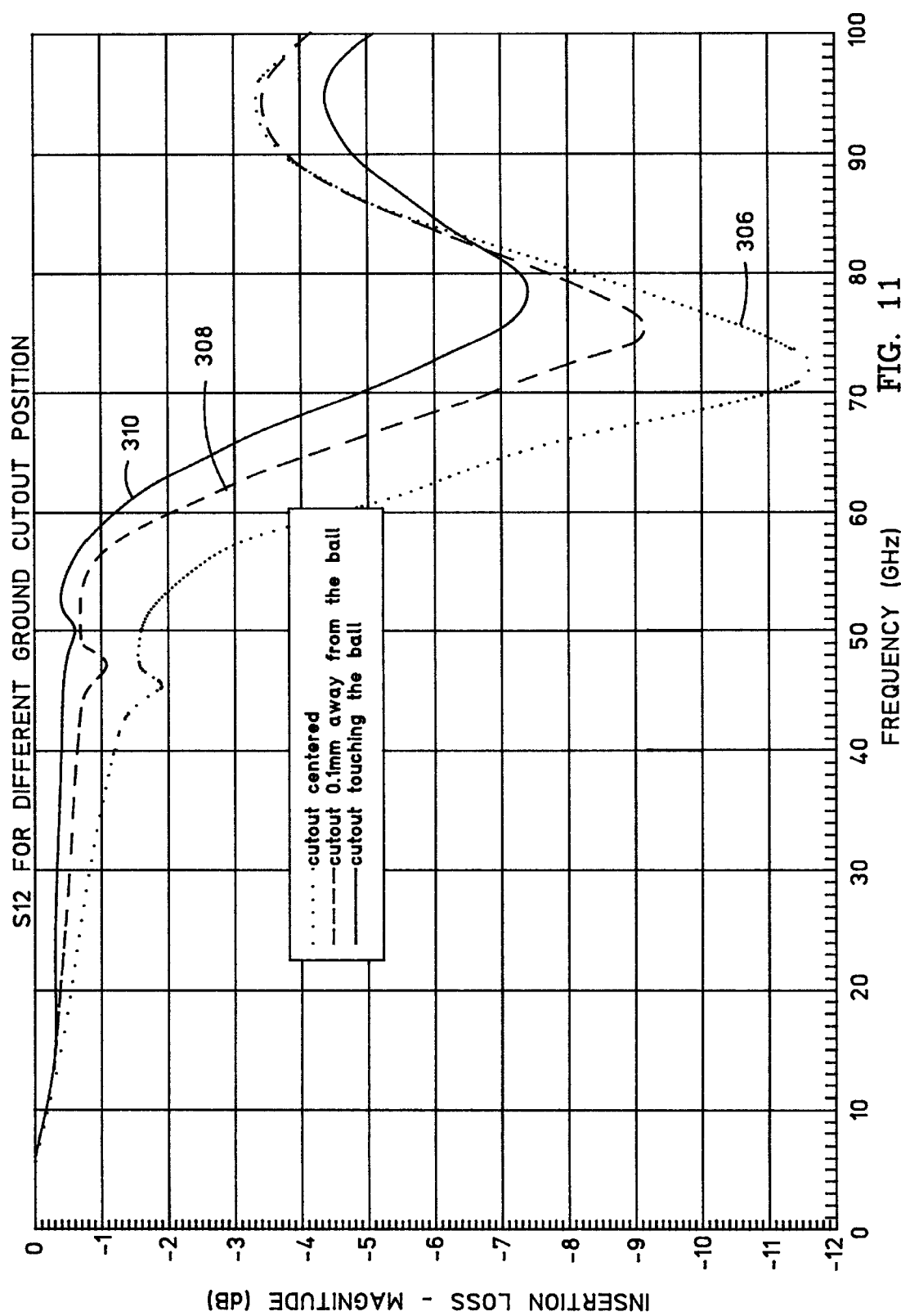

ELECTRONIC PACKAGE WITH OFFSET REFERENCE PLANE CUTOUT

FIELD OF THE INVENTION

The present invention relates generally to electronic packages. More particularly, the present invention relates to the design of electronic package reference planes utilized to support trace-to-terminal transitions.

BACKGROUND OF THE INVENTION

An electronic device package typically includes a substrate and an interconnect structure for routing signals from conductive traces or pads on the top surface of the substrate to connection terminals (e.g., solder balls) on the bottom surface of the substrate. For example, electronic chips and/or high speed signal connectors are often mounted in ball grid array ("BGA") packages that can be easily attached to a printed circuit board ("PCB") or an electronic component. A BGA package designed to accommodate a high speed signal typically includes conductive traces (e.g., a coplanar waveguide) formed on an upper surface of the BGA substrate and an interconnect structure that provides conductive paths from the conductive traces to the BGA solder balls located on the board-mounting substrate surface. The solder balls are attached to the substrate by way of capture pads formed at the bottom metal layer of the substrate. BGA packages are often utilized for high speed electronic devices, e.g., circuits that handle input and/or output signals having data rates of up to 40 Gbps. At high frequencies, the BGA capture pads and solder balls represent electrical discontinuities that limit the bandwidth of a signal propagating through the package. Indeed, in high speed applications, the trace-to-terminal transition can cause problematic impedance mismatching, high insertion loss, and high reflection loss.

BRIEF SUMMARY OF THE INVENTION

An electronic package according to a preferred embodiment utilizes a conductive reference plane having a cutout that is offset relative to the associated high speed signal solder ball. The offset cutout supports a longer portion of the high speed signal and also may reduce the capacitance load of the signal solder ball, which improves the impedance matching for high frequency signals propagating through the package. Consequently, the offset cutout improves the return loss, insertion loss, and bandwidth characteristics of the electronic package.

The above and other aspects of the present invention may be carried out in one form by a BGA package comprising a multilayer substrate having a mounting surface and one or more conductive layers, a signal solder ball attached to the multilayer substrate and coupled to a high speed signal trace formed at one of the conductive layers, and a reference plane formed at one of the conductive layers. The reference plane has a cutout region formed therein, where the cutout region has a lateral center point that is laterally offset relative to the lateral center point of the signal solder ball.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

FIG. 11 is a graph depicting insertion loss characteristics for an electronic package that employs offset reference plane cutouts.

DETAILED DESCRIPTION OF A PREFERRED EMBODIMENT

The particular implementations shown and described herein are illustrative of the invention and its best mode and are not intended to otherwise limit the scope of the invention in any way. Indeed, for the sake of brevity, conventional techniques related to electronic package manufacturing, high speed signal transmission (such as coplanar waveguide, microstrip, and stripline design), interconnect via design and fabrication, capture pad fabrication, solder bump composition, deposition, and reflow, and other aspects of the example embodiments may not be described in detail herein.

An electronic package or interconnect substrate functions as an interface between one or more signal sources and a component such as an electronic device, a circuit board, a mounting assembly, or the like. For example, a BGA package includes a number of conductive solder "balls" that function as connection points for electronic signals or sources. A signal routed by a BGA package may be generated by an electronic device mounted to the package substrate, or it may be received by the BGA package through a suitable connector.

Figure 1:
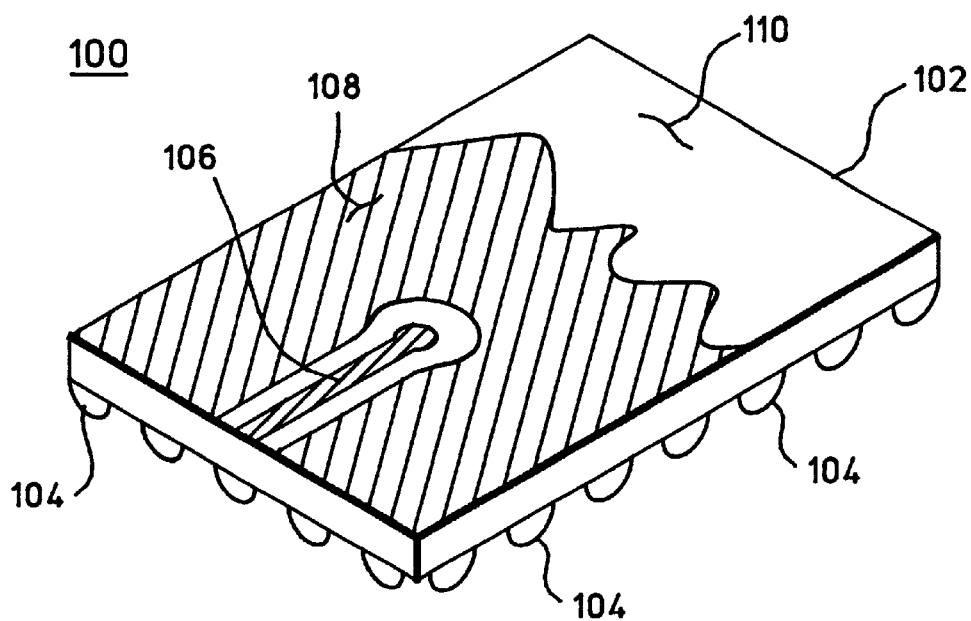
FIG. 1 is a perspective view of an electronic package.

FIG. 1 is a perspective view of an example BGA package 100. Although the preferred embodiment described herein is a BGA package, the concept can be equivalently applied to other electronic package configurations. BGA package 100 includes a multilayer substrate 102 having a number of conductive layers separated by dielectric layers, an interconnect structure (hidden from view in FIG. 1) that provides conductive paths through and within substrate 102, and a number of connection terminals (e.g., solder balls) 104 attached to the mounting surface of substrate 102. In this example, BGA package 100 includes a conductive high speed signal trace 106 formed at the top conductive layer, and a conductive reference or ground plane 108, also formed at the top conductive layer. For the sake of illustration, a portion of the top conductive layer is removed from BGA package 100, exposing a dielectric layer 110 that supports the top conductive layer. Signal trace 106 and reference plane 108 form a coplanar waveguide ("CPW") transmission line for a high speed signal. Although not shown in FIG. 1, a practical BGA package may propagate high speed signals using a CPW mode, a microstrip mode, a stripline mode, or a combination thereof. The source of the high speed signal is unimportant for purposes of the present invention.

Figure 2:
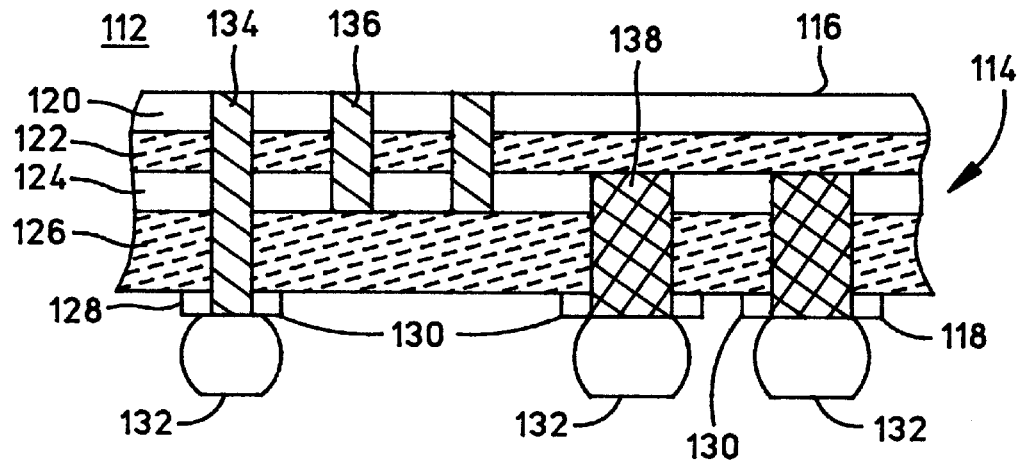
FIG. 2 is a cross sectional view of an electronic package.

FIG. 2 is a cross sectional view of a portion of an electronic package 112. Electronic package 112 includes a multilayer substrate 114 having an upper surface 116 and a lower mounting surface 118. For purposes of this example, substrate 114 includes a conductive layer 120, a dielectric layer 122, a conductive layer 124, a dielectric layer 126, and a conductive layer 128. In practice, an electronic package may include any number of conductive metal layers sandwiched between dielectric layers.

Conductive layer 120 defines a pattern of conductive traces, e.g., conductive signal traces and/or conductive reference traces, configured to propagate high speed signals from one location on electronic package 112 to another location on electronic package 112. In the example embodiment described in more detail below, conductive layer 120 includes a conductive signal trace and a corresponding conductive reference plane that combine to form a CPW transmission line. Conductive layer 124 may also define a pattern of conductive traces; in the example embodiment, conductive layer 124 is a reference plane that cooperates with the conductive signal trace to support a microstrip transmission mode. Conductive layer 128 comprises a number of conductive capture pads 130 that facilitate attachment of solder balls 132 to substrate 114. In practical embodiments, the conductive traces and elements are formed from the respective conductive layers using conventional techniques, e.g., masking and etching.

The various conductive elements in substrate 114 may be interconnected and/or connected to solder balls 132 by way of conductive interconnect vias. For example, FIG. 2 depicts an interconnect via 134 that forms a conductive path between an element on conductive layer 120 and one capture pad 130. FIG. 2 also depicts an interconnect via 136 that forms a conductive path between an element on conductive layer 120 and an element on conductive layer 124. As another example, an interconnect via 138 forms a conductive path between an element on conductive layer 124 and one capture pad 130. The length, size, and shape of the interconnect vias can vary within substrate 114 depending upon the particular design. The interconnect vias can be formed using any number of conventional techniques.

Figure 3:
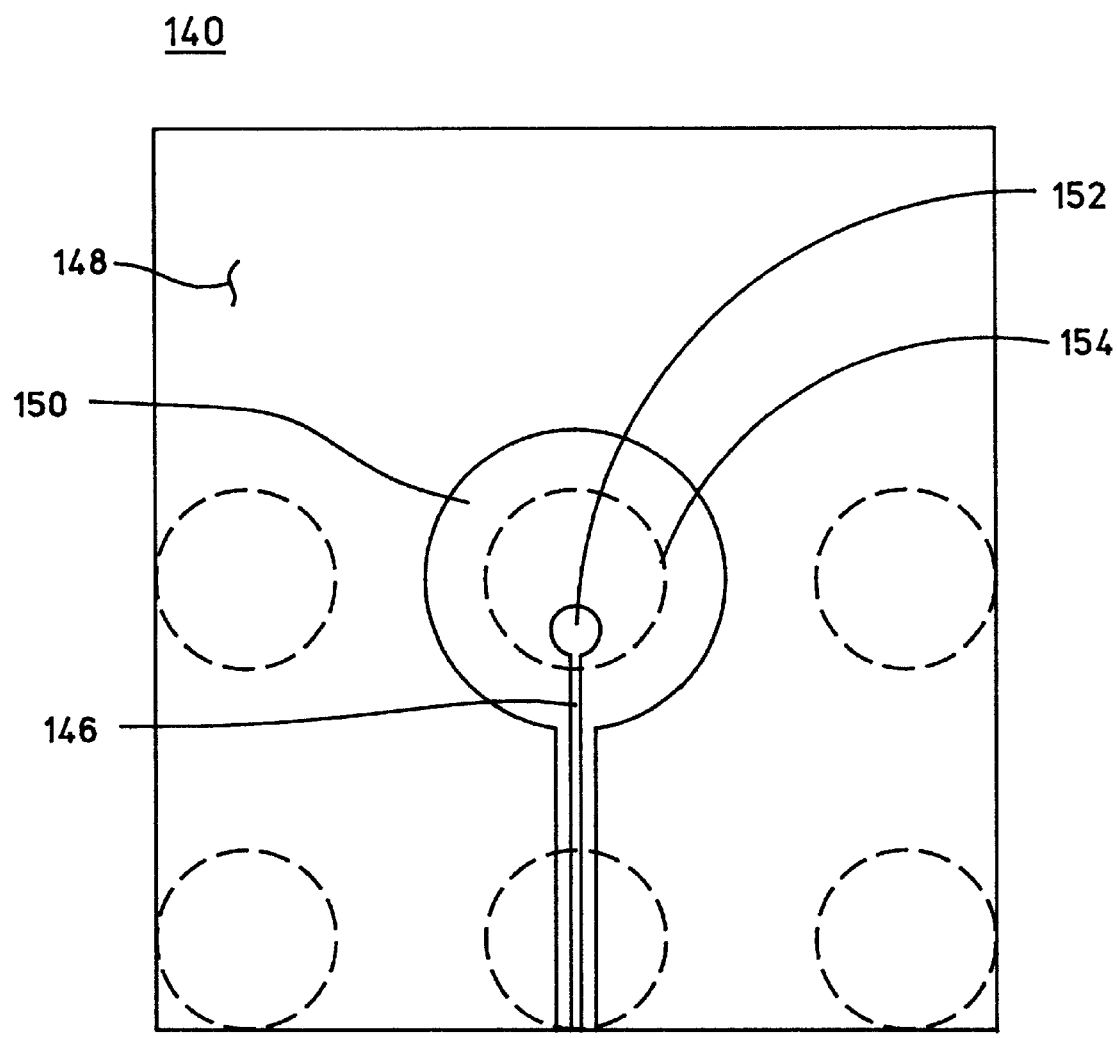
FIG. 3 is a plan view of the top conductive layer of a prior art electronic package.
Figure 4:
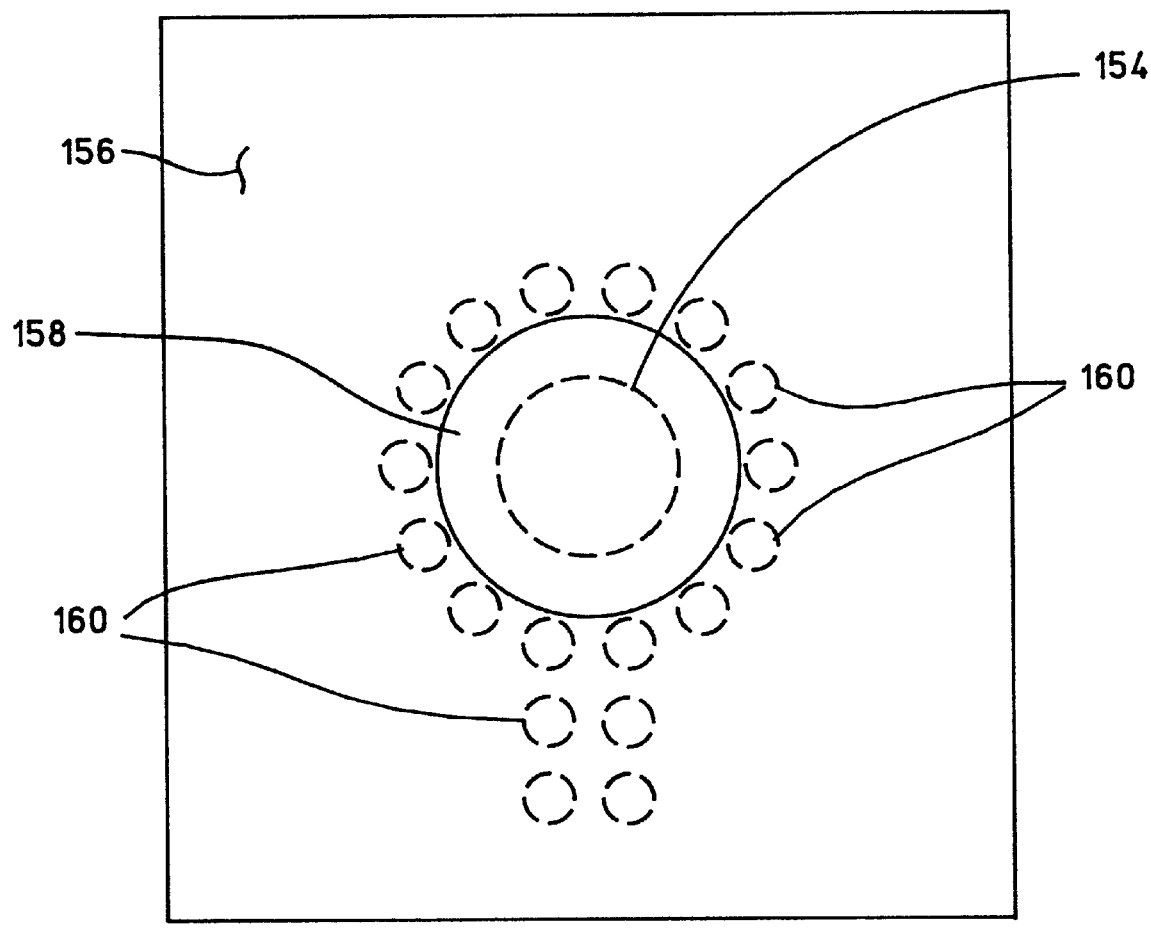
FIG. 4 is a plan view of an internal conductive layer of a prior art electronic package.
Figure 5:
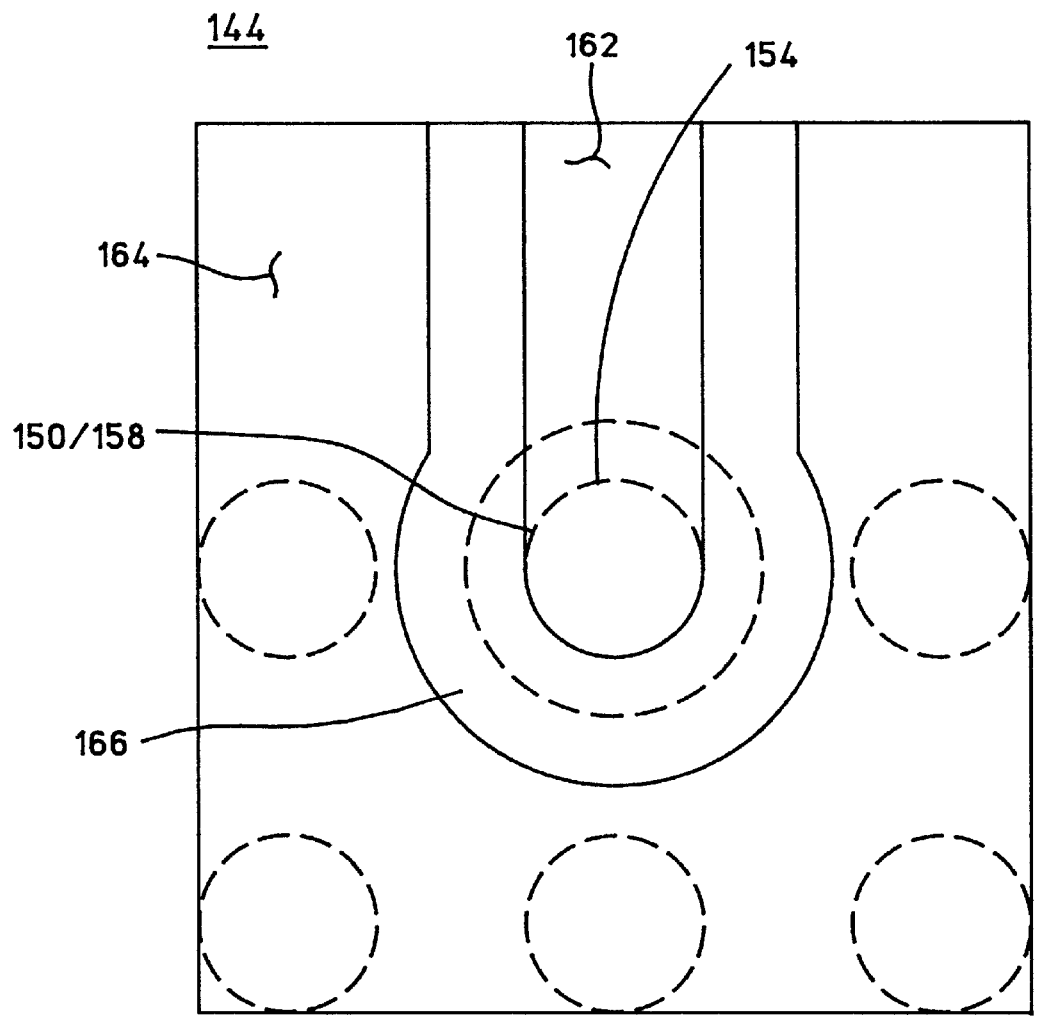
FIG. 5 is a plan view of a component to which a prior art electronic package can be mounted.

FIG. 3 is a plan view of the top metal layer 140 of a prior art electronic package, FIG. 4 is a plan view of an internal metal layer 142 of the electronic package, and FIG. 5 is a plan view of a component 144 to which the electronic package can be mounted. Top metal layer 140 is configured to define a conductive signal trace 146 and a conductive reference or ground plane 148. Ground plane 148 is shaped such that it includes a cutout region 150 that surrounds signal trace 146.

Signal trace 146 terminates at a location relative to a corresponding signal solder ball (or capture pad) position. As shown in FIG. 3, signal trace 146 may terminate at a conductive pad 152 to which an interconnect via (not shown) is attached. The opposite end of the interconnect via is connected to a signal solder ball 154. Signal solder ball 154 and five reference solder balls are depicted in dashed lines because they do not reside on top metal layer 140. The relative positioning of signal solder ball 154, i.e., the projection of solder ball 154 onto top metal layer 140, is shown in FIG. 3. Notably, signal solder ball 154 is concentric with the circular portion of cutout region 150. In other words, the lateral center point of signal solder ball 154 is laterally aligned with the lateral center point of cutout region 150.

Referring to FIG. 4, a dielectric layer separates internal metal layer 142 from top metal layer 140. Internal metal layer 142 cooperates with top metal layer 140 to establish a microstrip transmission mode for the high speed signal carried by the CPW. In this regard, internal metal layer 142 includes a reference plane 156 having the same AC potential as reference plane 148. Internal metal layer 142 includes a cutout region 158 that is laterally aligned with the cutout region 150 formed in reference plane 148. In other words, from the top view perspective of FIGS. 3–5, the circular outlines of the two cutout regions overlap each other. Consequently, signal solder ball 154 is also concentric with cutout region 158, as shown in FIG. 4.

The small circles in FIG. 4 represent a number of interconnect vias 160 connected between reference plane 140 and reference plane 156. Vias 160 are depicted in dashed lines because they do not reside on internal metal layer 142. Vias 160 ensure that the two reference planes are coupled together to short microstrip transmission with CPW mode to create a mixed mode. Vias 160 are positioned such that they do not interfere with conductive signal trace 146. The longitudinal cross section of vias 160 may be similar to interconnect via 136 (see FIG. 2).

Referring to FIG. 5, component 144 may be a printed circuit board, a component substrate, or the like. The solder balls of the electronic package establish physical and electrical connections with corresponding points on component 144. In this regard, FIG. 5 depicts signal solder ball 154 (and five reference solder balls) in dashed lines to represent the mounting position of the electronic package relative to component 144. Component 144 may include a conductive signal trace 162 to which signal solder ball 154 is connected, and a conductive reference or ground element 164 to which the reference solder balls are connected. In this example, signal trace 162 and reference element 164 cooperate to form a CPW transmission line.

Reference element 164 defines a cutout region 166 having a generally circular shape that is concentric with signal solder ball 154 and cutout regions 150/158. In FIG. 5, the projection of cutout regions 150/158 onto component 144 is depicted in dashed lines. As shown in FIG. 5, the reference solder balls do not interfere with cutout region 166 or with signal trace 162. Furthermore, signal solder ball 154 does not interfere with cutout region 166 of with reference plane 164.

Although the reference plane cutout regions are intended to reduce the capacitance associated with the signal solder ball, prior art designs may not be optimized for very high speed applications. For example, the cutout design depicted in FIGS. 3–5 causes a portion of the conductive signal trace 146 to "lose" its ground plane reference (as shown in FIG. 3, the section of signal trace 146 that enters the circular cutout region 150 is not closely surrounded by the reference plane), which can be detrimental in very high speed applications.

Figure 6:
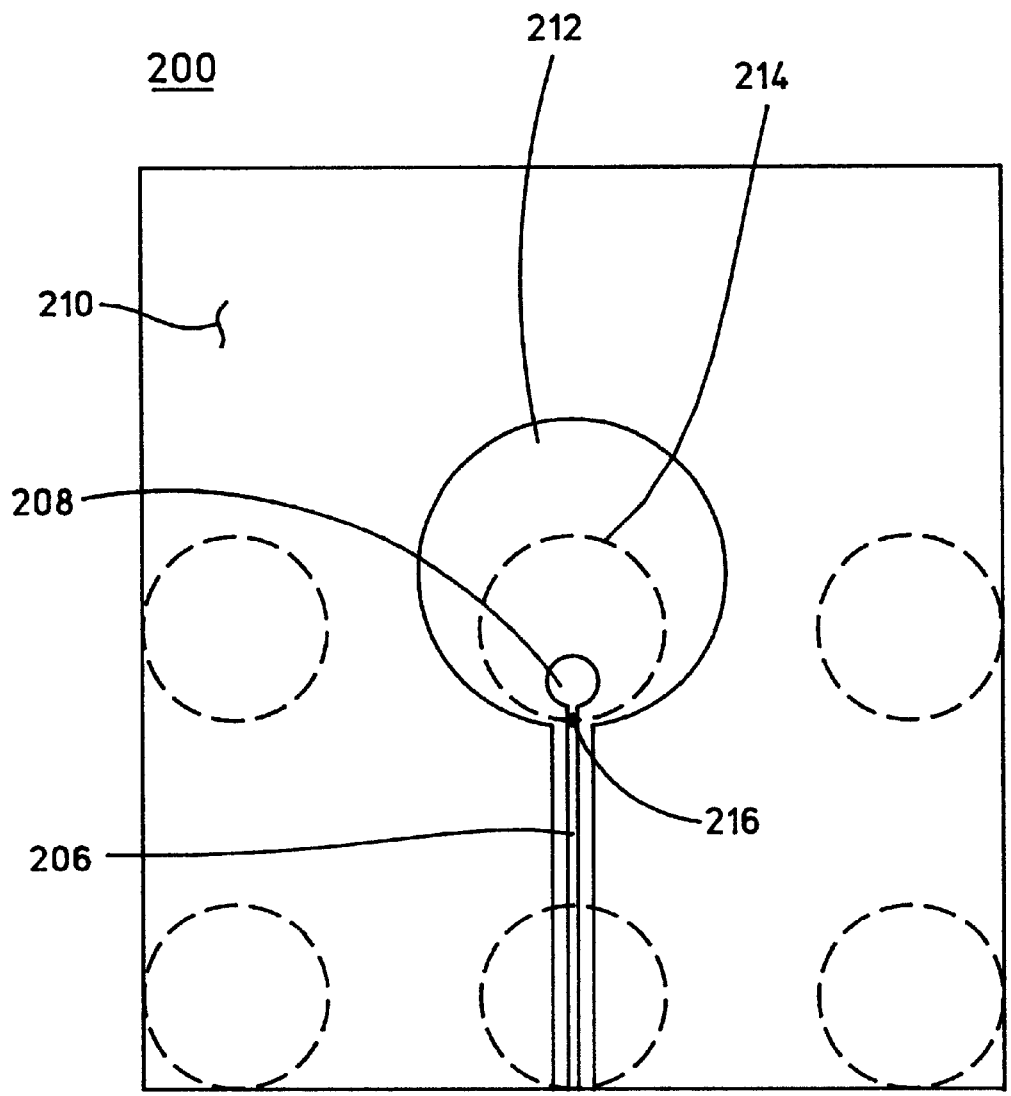
FIG. 6 is a plan view of the top conductive layer of an electronic package that employs an offset reference plane cutout.
Figure 7:
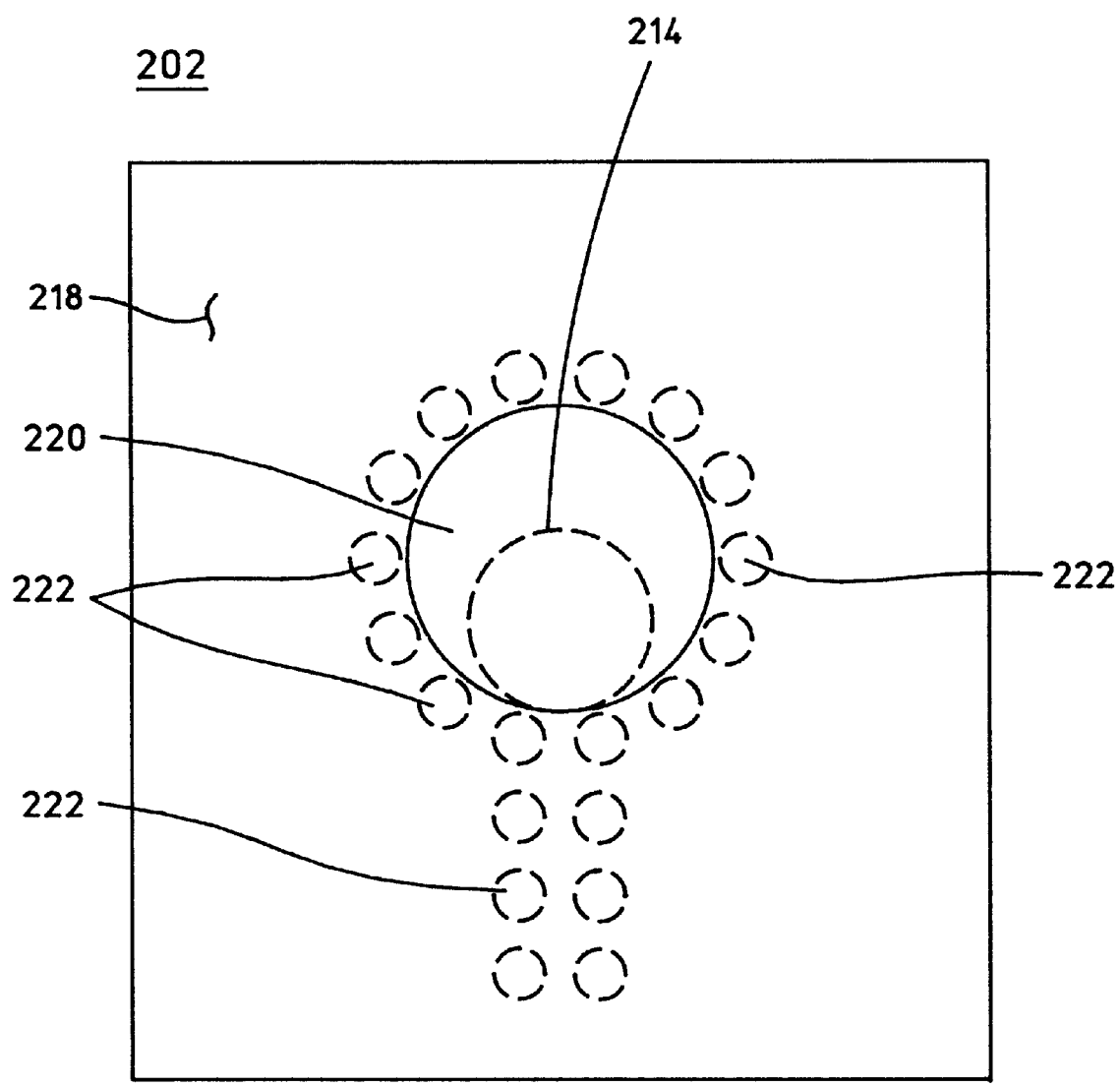
FIG. 7 is a plan view of an internal conductive layer of an electronic package that employs an offset reference plane cutout.
Figure 8:
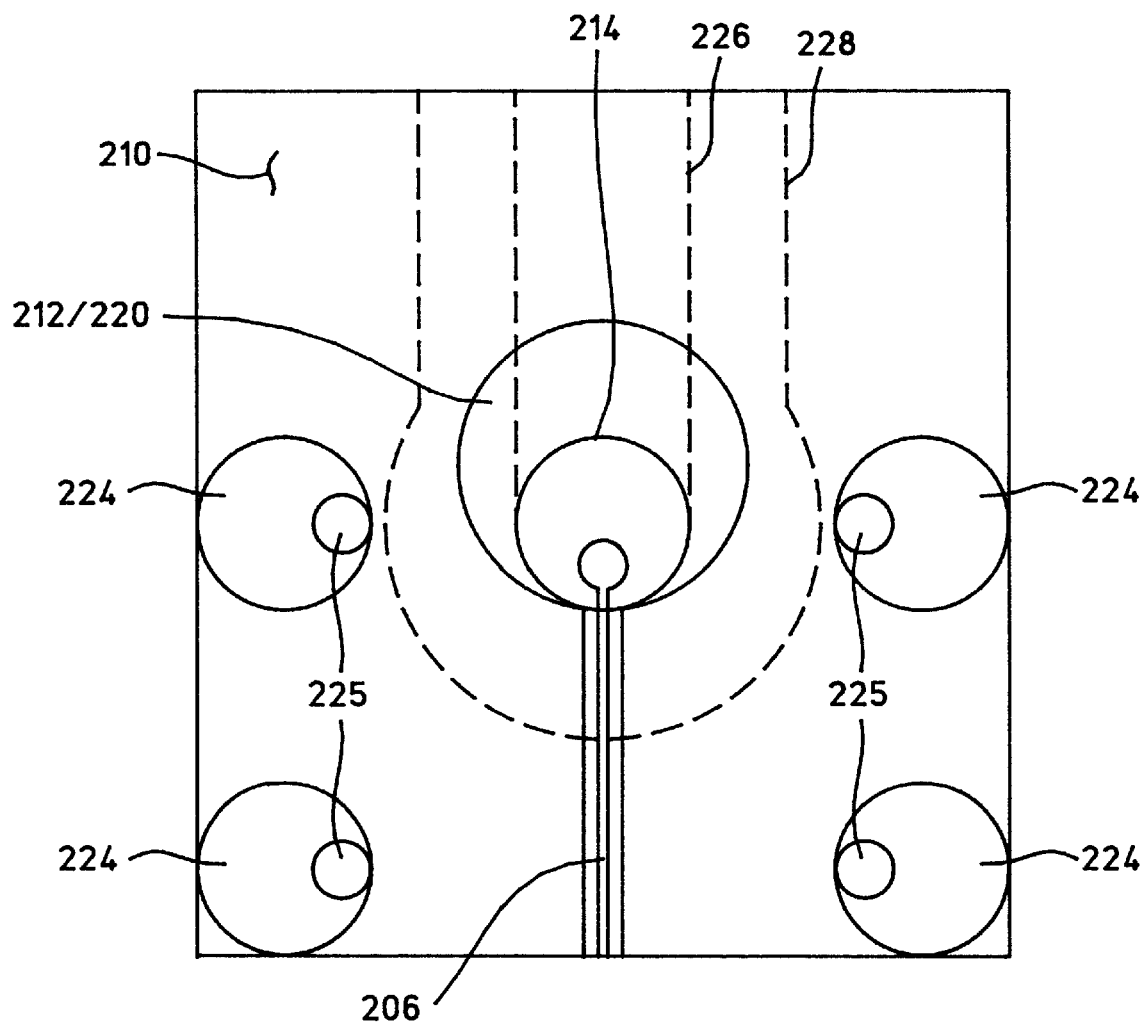
FIG. 8 is a phantom plan view of an electronic package mounted to a compatible component.

FIGS. 6–8 depict various layers of an electronic package according to a preferred embodiment. The electronic package employs an offset reference cutout region that improves the high frequency transmission characteristics of the package. The offset reference cutout feature may be implemented in the context of a CPW structure, a microstrip structure, a stripline structure, or a combination thereof. The electronic package generally includes a multilayer substrate having a number of conductive layers separated by dielectric layers, and connection terminals (e.g., BGA solder balls) attached to the mounting surface of the substrate. These general aspects of the electronic package need not differ from prior art packages (see FIG. 2 and related description). FIG. 6 is a plan view of the top conductive layer 200 of the electronic package, FIG. 7 is a plan view of an internal conductive layer 202 of the electronic package, and FIG. 8 is a phantom plan view of the electronic package mounted to a compatible component.

Referring to FIG. 6, the top conductive layer 200 includes a high speed signal trace 206 formed therein. Signal trace 206 may terminate at a suitably configured pad 208 that facilitates connection to an interconnect via. In the example embodiment, the top conductive layer 200 also forms a reference plane 210 having a cutout region 212 defined therein. In this embodiment, cutout region 212 has a generally circular perimeter that is contiguous with two straight sides, each of which is parallel to signal trace 206. The thickness of signal trace 206 and the width of the gaps between signal trace 206 and reference plane 210 are selected to support a CPW transmission mode with a desired impedance.

Signal trace 206 terminates at a location relative to a corresponding signal capture pad position. A signal capture pad 214 and five reference capture pads are depicted in dashed lines because they do not reside on top conductive layer 200. The dashed lines may also represent the projection of solder balls onto top conductive layer 200. In other words, from the top view perspective of FIGS. 6–8, the dashed lines may represent the longitudinal cross sectional profiles of the solder balls taken at their widest points. Thus, for purposes of this description, the projection of signal capture pad 214 and its corresponding solder ball onto the conductive layers need not be distinguished. Signal trace 206 is connected to one end of a conductive interconnect via at pad 208, and the other end of the via is connected to signal capture pad 214. Conductive connection terminals, such as BGA solder balls, are attached to signal capture pad 214 and the reference capture pads.

The relative positioning of signal capture pad 214, i.e., the projection of capture pad 214 onto top conductive layer 200, is shown in FIG. 6. The circular portion of cutout region 212 is offset from the center of signal capture pad 214. In other words, the lateral center point of signal capture pad 214 is laterally offset relative to the lateral center point of cutout region 212. As shown in FIG. 6, the distance between the lateral center point of signal capture pad 214 and the point where high speed signal trace 206 enters cutout region 212 is less than the distance between the lateral center point of signal capture pad 214 and the point on cutout region 212 that is opposite the entry point.

In contrast to the prior art configuration shown in FIG. 3, signal trace 206 enters the circular portion of cutout region 212 and terminates a short distance after the entry point. In other words, only a small span of signal trace 206 is left without an immediately surrounding parallel edge of reference plane 210. The projection of signal capture pad 214 onto top conductive layer 200 intersects signal trace 206 at an edge location 216 (FIG. 6 includes an identifying dot at edge location 216). In the example embodiment, cutout region 212 is biased away from edge location 216 such that signal trace 206 terminates shortly after entering cutout region 212. In accordance with a preferred embodiment, the projection of signal capture pad 214 onto the top conductive layer is tangential to cutout region 212. More specifically, edge location 216 corresponds to the theoretical tangent point.

The projection of signal capture pad (or the signal solder ball) 214 onto the reference plane 210 is surrounded by cutout region 212. In other words, from the top view perspective of FIGS. 6–8, the profile or boundary of signal capture pad 214 does not cross the profile or boundary of cutout region 212. This aspect of the electronic package contributes to the reduction of capacitance associated with the signal solder ball.

Referring to FIG. 7, a dielectric layer separates internal conductive layer 202 from top conductive layer 200. Internal metal layer 202 cooperates with top conductive layer 200 to establish a microstrip transmission mode for the high speed signal carried by the CPW. Internal conductive layer 202 includes a reference plane 218 having the same AC potential as reference plane 210. Internal conductive layer 202 also includes a cutout region 220 that is laterally aligned with the cutout region 212 formed in reference plane 210. In other words, from the top view perspective of FIGS. 6–8, the circular outlines of the two cutout regions overlap each other. Consequently, signal capture pad 214 is also offset relative to cutout region 220, as shown in FIG. 7. Indeed, the relative position of signal capture pad 214 (and/or the respective solder ball) and cutout region 220 is the same as that described above in the context of FIG. 6.

As described above in connection with the prior art arrangement, the electronic package may employ a number of interconnect vias 222 connected between reference plane 210 and reference plane 218. FIG. 7 depicts these vias 222 in dashed lines because they do not reside on internal conductive layer 202.

FIG. 8 is a phantom plan view of an electronic package mounted to a compatible component. For purposes of this example, the features of the component are as described above in connection with FIG. 5. FIG. 8 illustrates the relative positioning of the electronic package elements and the component elements. The following elements are shown in FIG. 8: signal trace 206; reference plane 210; cutout regions 212/220; capture pad (solder ball) 214; reference capture pads 224 (for the sake of clarity, only four reference capture pads are shown); interconnect vias 225 representing conductive paths between reference plane 218 (see FIG. 7) and the respective reference capture pads 224; a high speed conductive signal trace 226 formed on the surface of the component; and a conductive reference plane 228 formed on the surface of the component. The component elements are shown in dashed lines.

The component reference plane 228 defines a cutout region that surrounds the component signal trace 226. In this example, the cutout region includes a generally circular portion. Notably, when the electronic package is mounted to a compatible component, the signal solder ball 214 is centered within the cutout region of reference plane 228. In this regard, the lateral center point of signal solder ball 214 is aligned with the lateral center point of the circular portion of the component cutout region. The projection of cutout regions 212/220, however, are offset relative to the component cutout region.

Figure 9:
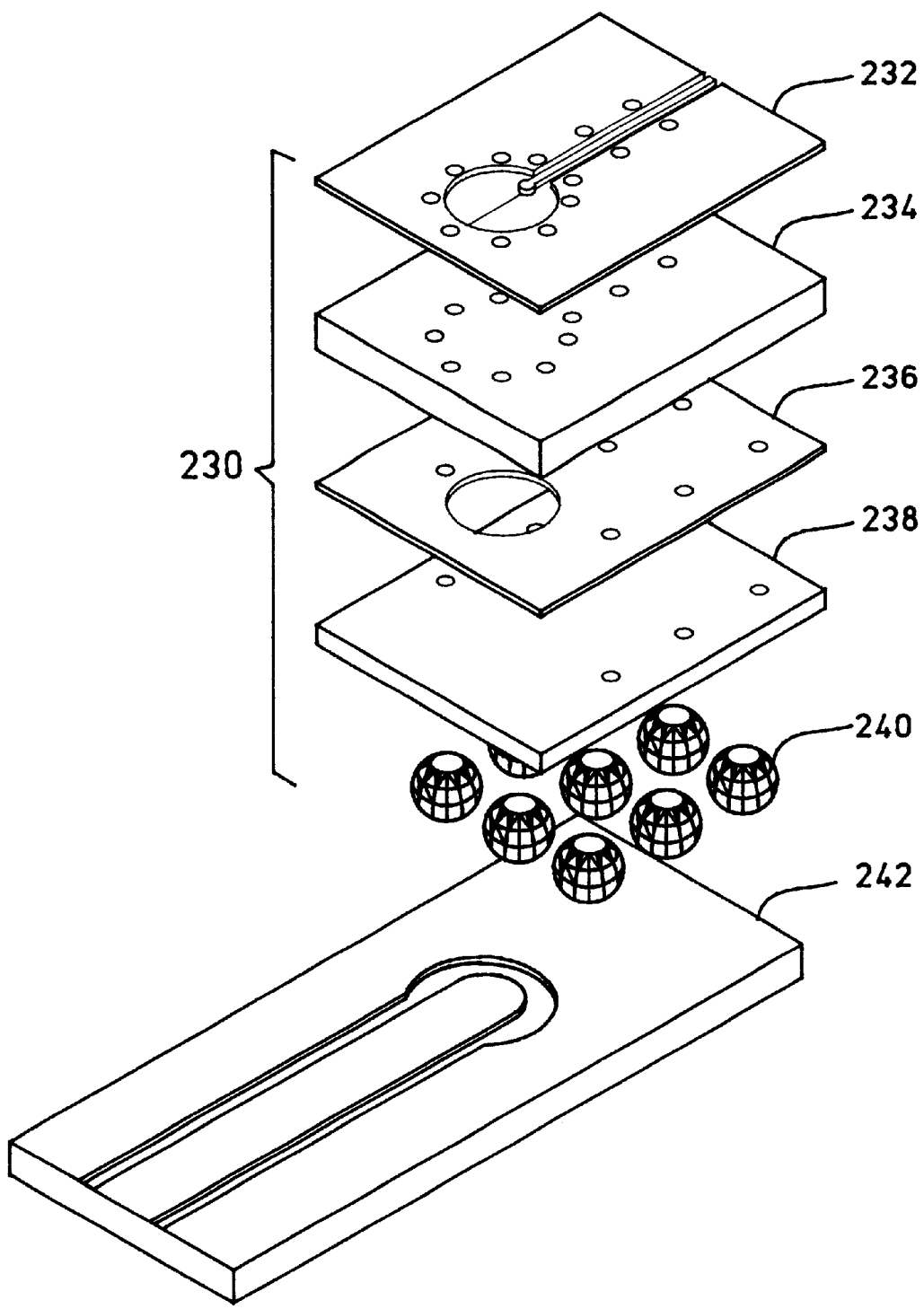
FIG. 9 is an exploded perspective view of an electronic package that includes the features shown in FIGS. 6–8.

FIG. 9 is an exploded perspective view of an electronic package 230 that includes the features and conductive layers described above in connection with FIGS. 6–8. FIG. 9 illustrates the relative positioning and alignment of the various elements of the electronic package, including the top conductive layer 232, a dielectric layer 234, an internal conductive layer 236, a dielectric layer 238, solder balls 240, and a portion of a circuit board component 242 to which electronic package 230 can be mounted.

Figure 10:
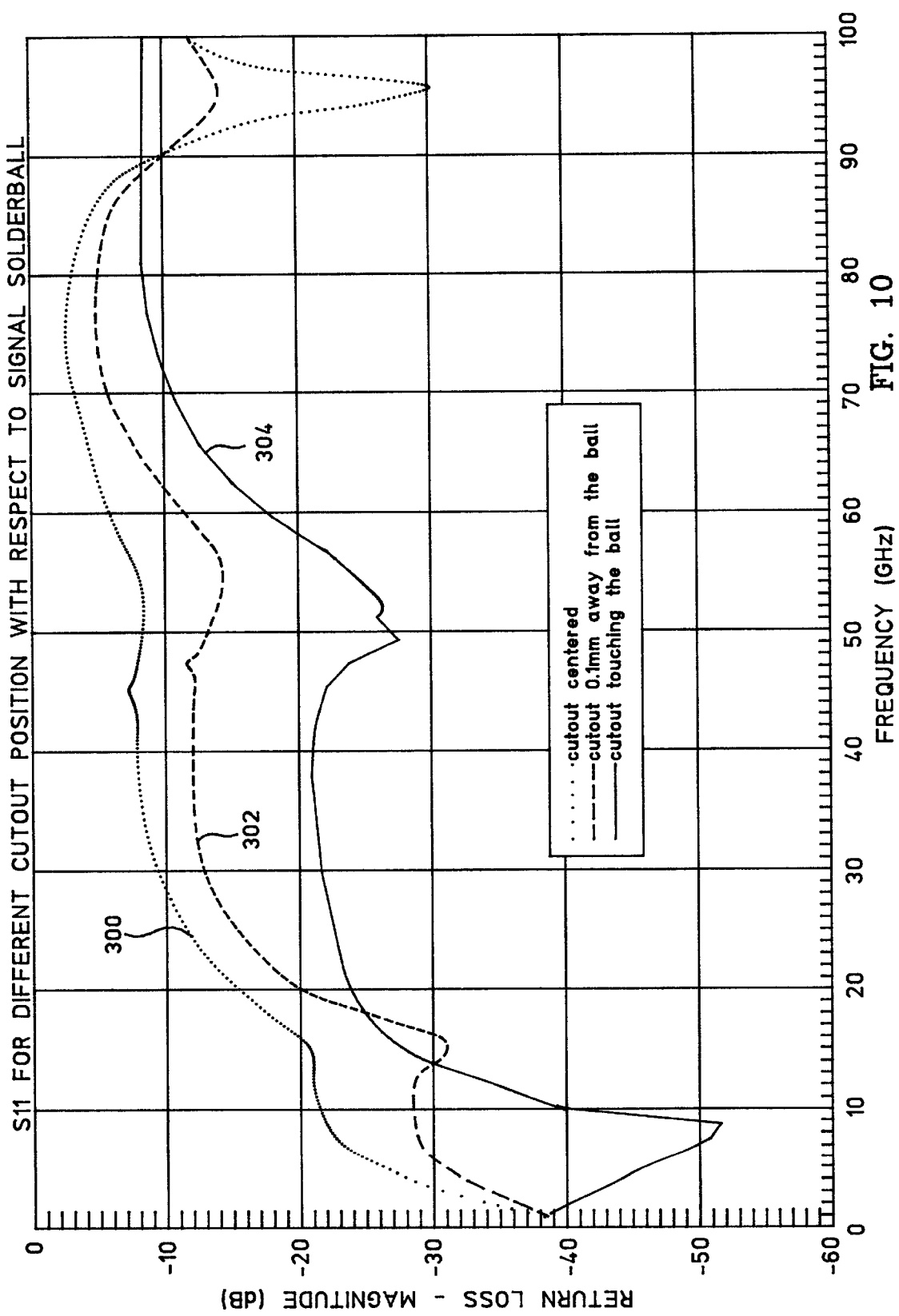
FIG. 10 is a graph depicting return loss characteristics for an electronic package that employs offset reference plane cutouts.

FIG. 10 is a graph depicting return loss characteristics for an electronic package that employs offset reference plane cutouts, and FIG. 11 is a graph depicting insertion loss characteristics for the same electronic package. These graphs were generated by computer simulation software and were based on solid model representations of electronic packages, e.g., the electronic package represented by FIGS. 6–9. For purposes of the simulation, the transmission line impedance is 50 Ohms, the pitch between the signal solder ball and each of the five reference solder balls is 1.0 mm, the size of each solder ball is 24 mils, and the diameter of the reference cutout regions is 1.0 mm.

FIG. 10 includes a plot 300 of return loss for a conventional package having a centered reference cutout region, a plot 302 of return loss for a package in which the reference cutout region is displaced 0.1 mm away from the signal solder ball projection, and a plot 304 of return loss for the package described above (in which the reference cutout region is tangential to the signal solder ball projection). FIG. 10 indicates that return loss characteristics of the package improve with increasing offset of the reference cutout region. FIG. 11 includes a plot 306 of insertion loss for a conventional package having a centered reference cutout region, a plot 308 of insertion loss for a package in which the reference cutout region is displaced 0.1 mm away from the signal solder ball projection, and a plot 310 of insertion loss for the package described above. FIG. 11 indicates that insertion loss characteristics of the package also improve with increasing offset of the reference cutout region. The improvement in signal transmission characteristics ultimately results in a higher signal-to-noise ratio over a wide frequency band.

As mentioned above, the example electronic package described herein is configured to support a mixed signal transmission mode (CPW and microstrip). Accordingly, the package includes an upper conductive layer containing both a high speed signal trace and a corresponding reference element. The package also includes an underlying conductive layer that defines another reference element. In other words, the package is configured as a back-grounded CPW. In contrast, a true CPW embodiment would employ the upper conductive layer without the underlying additional reference plane. A microstrip embodiment would utilize the upper conductive layer for the signal trace and an underlying conductive layer for a reference plane. A stripline embodiment would utilize an upper conductive reference layer, an intermediate conductive signal trace layer, and a lower conductive reference layer. The offset reference plane cutout configuration can also be utilized in such alternate embodiments.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An electronic package comprising:
   a multilayer substrate having a mounting surface and one or more conductive layers;
   a signal connection terminal attached to said mounting surface of said multilayer substrate and coupled to a high speed signal trace formed at one of said conductive layers, said signal connection terminal having a first lateral center point; and
   a reference plane formed at one of said conductive layers, said reference plane having a cutout region formed therein, said cutout region having a second lateral center point that is laterally offset relative to said first lateral center point.

2. An electronic package according to claim 1, wherein:
   said signal connection terminal has a cross sectional profile; and
   the projection of said cross sectional profile onto said reference plane is surrounded by said cutout region.

3. An electronic package according to claim 1, wherein:
   said signal connection terminal has a cross sectional profile; and
   the projection of said cross sectional profile onto said reference plane is tangential to said cutout region.

4. An electronic package according to claim 1, wherein said signal connection terminal is a solder ball.

5. An electronic package according to claim 1, wherein said high speed signal trace and said reference plane are formed at the same conductive layer of said multilayer substrate.

6. An electronic package according to claim 1, wherein said high speed signal trace is formed at a first conductive layer of said multilayer substrate and said reference plane is formed at a second conductive layer of said multilayer substrate.

7. An electronic package according to claim 1, wherein:
   said reference plane is formed at a first conductive layer of said multilayer substrate; and
   said electronic package further comprises a second reference plane formed at a second conductive layer of said multilayer substrate, said second reference plane having a cutout region that is laterally aligned with said cutout region of said reference plane.

8. An electronic package comprising:
   a multilayer substrate having one or more conductive layers, including a conductive mounting surface layer;
   a capture pad formed at said conductive mounting surface layer and coupled to a high speed signal trace formed at one of said conductive layers, said capture pad having a first lateral center point; and
   a reference plane formed at one of said conductive layers, said reference plane having a cutout region formed therein, said cutout region having a second lateral center point that is laterally offset relative to said first lateral center point.

9. An electronic package according to claim 8, wherein the projection of said capture pad onto said reference plane is surrounded by said cutout region.

10. An electronic package according to claim 8, wherein the projection of said capture pad onto said reference plane is tangential to said cutout region.

11. An electronic package according to claim 8, further comprising a connection terminal coupled to said capture pad.

12. An electronic package according to claim 8, wherein said high speed signal trace and said reference plane are formed at the same conductive layer of said multilayer substrate.

13. An electronic package comprising:
   a multilayer substrate having one or more conductive layers;
   a high speed signal trace formed at a first conductive layer of said multilayer substrate;
   a capture pad formed at a second conductive layer of said multilayer substrate and coupled to said high speed signal trace, the projection of said capture pad onto said first conductive layer intersecting said high speed signal trace at an edge location; and a reference plane formed at one of said conductive layers, said reference plane having a cutout region formed therein, the projection of said cutout region onto said first conductive layer being biased away from said edge location.

14. An electronic package according to claim 13, wherein the projection of said capture pad onto said reference plane is surrounded by said cutout region.

15. An electronic package according to claim 13, wherein the projection of said capture pad onto said reference plane is tangential to said cutout region.

16. An electronic package according to claim 13, wherein:

said capture pad has a first lateral center point; and said cutout region has a second lateral center point that is laterally offset relative to said first lateral center point.

17. An electronic package according to claim 13, wherein said high speed signal trace and said reference plane are formed at the same conductive layer of said multilayer substrate.

18. An electronic package according to claim 13, wherein said reference plane is formed at a conductive layer other than said first conductive layer of said multilayer substrate.

* * * * *